United States Patent
Hirano et al.

(10) Patent No.: US 7,036,980 B2
(45) Date of Patent: May 2, 2006

(54) APPARATUS AND METHOD FOR FORMING PATTERN

(75) Inventors: Ryoichi Hirano, Tokyo (JP); Satoshi Imura, Numazu (JP); Noriaki Nakayamada, Numazu (JP)

(73) Assignees: Kabushiki Kaisha Toshiba, Tokyo (JP); Toshiba Machine Co., Ltd., Tokyo (JP)

( * ) Notice: Subject to any disclaimer, the term of this patent is extended or adjusted under 35 U.S.C. 154(b) by 201 days.

(21) Appl. No.: 10/329,514

(22) Filed: Dec. 27, 2002

(65) Prior Publication Data

US 2006/0034344 A1    Feb. 16, 2006

(30) Foreign Application Priority Data

Dec. 27, 2001   (JP) .............................. 2001-398013

(51) Int. Cl.
  *G01K 13/12* (2006.01)
  *G01K 1/16* (2006.01)
(52) U.S. Cl. ...................... 374/137; 374/100; 374/120; 355/30; 355/72; 250/492.22; 250/492.3; 430/330; 430/942
(58) Field of Classification Search ................ 430/296, 430/330, 942; 374/100, 120, 137; 250/492.22, 250/548, 442.11, 443.11; 355/30, 72
See application file for complete search history.

(56) References Cited

U.S. PATENT DOCUMENTS 5,231,291 A * 7/1993 Amemiya et al. ....... 250/443.1
6,676,289 B1 * 1/2004 Hirano et al. ................ 374/141

* cited by examiner

*Primary Examiner*—John A. McPherson
*Assistant Examiner*—Daborah Chacko-Davis
(74) *Attorney, Agent, or Firm*—Pillsbury Winthrop Shaw Pittman, LLP

(57) ABSTRACT

A pattern forming apparatus includes a drawing chamber having a drawing substrate on which an original pattern is drawn, a first temperature control unit having a first temperature regulator to make the temperature of the drawing chamber constant, and a constant-temperature member arranged near the drawing substrate. The pattern forming apparatus further includes a second temperature control unit having a second temperature regulator. The second temperature control unit is configured to control the set temperature of the constant-temperature member independently such that the temperature of the drawing substrate becomes substantially constant when the original pattern is drawn.

14 Claims, 4 Drawing Sheets

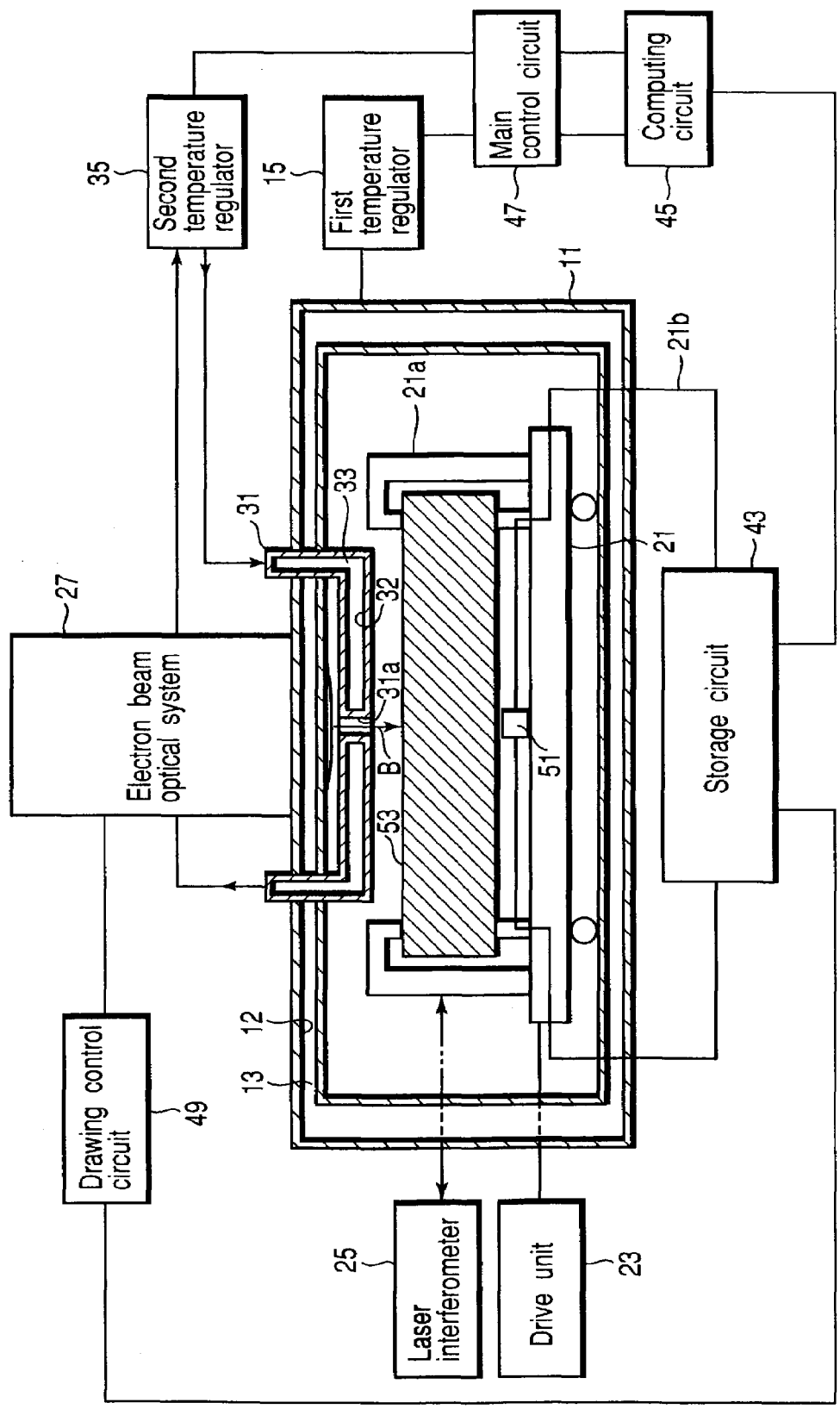
F I G. 4

APPARATUS AND METHOD FOR FORMING PATTERN

CROSS-REFERENCE TO RELATED APPLICATIONS

This application is based upon and claims the benefit of priority from the prior Japanese Patent Application No. 2001-398013, filed Dec. 27, 2001; the entire contents of which are incorporated herein by reference.

BACKGROUND OF THE INVENTION

1. Field of the Invention

The present invention relates to a pattern forming apparatus and a pattern forming method. More specifically, the invention relates to an apparatus and a method for manufacturing a reticle (or a mask) on which at least one original pattern is drawn.

2. Description of the Related Art

Recently, the circuit trace widths required for semiconductor devices have become narrower and narrower as an LSI (Large Scale Integrated Circuit) increases in packing density and capacity. This type of semiconductor device is conventionally fabricated by transferring several tens of kinds of original patterns with a desired circuit pattern from a reticle aligned with high precision to an exposure domain on a wafer.

Step-and-repeat equipment including a highly precise optical system and a highly precise X-Y stage is used for the transfer of the original patterns. The wafer is fixed on the X-Y stage so that its whole surface can be exposed with the original patterns, and moved relative to the optical system by step and repeat. Therefore, the step-and-repeat equipment is also referred to as a stepper.

The original pattern on the reticle is drawn on a glass substrate that is finished with high precision and formed as a chromium (Cr) pattern through an etching process and the like. Chromium (Cr) is usually vapor-deposited on one side of the glass substrate and resist is applied uniformly on the chromium (Cr). When the chromium (Cr) pattern is formed, the glass substrate is irradiated with an energy beam (electron beam) from an energy beam optical system. The resist-coated surface of the glass substrate is entirely scanned with a beam spot corresponding to design (drawing) data. Thus, an arbitrary chromium (Cr) pattern is formed by controlling chromium (Cr) etching according to the place of the substrate, using the resist deteriorated at the time of the scan. The chromium (Cr) pattern is formed by combining the narrowed beam spots into one original pattern. It is thus possible to draw a fine original pattern with high precision by controlling the positions of the beam spots accurately.

It has been said that the old stepper cannot resolve an original pattern of 1 micron or less in terms of the wavelength limit of light. The present stepper can resolve a fine original pattern of the order of submicron because of the improvement in optical and illumination systems and the appearance of a phase shift mask that controls the phase of light on a reticle.

If, however, the glass substrate varies in temperature during the drawing of a fine original pattern on the glass substrate, it expands and contracts. During the drawing, the glass substrate is fixed on a drawing stage whose position is controlled precisely. The control of a place of the glass substrate for drawing an original pattern is performed on the basis of the measured values of a laser interferometer. However, the laser interferometer cannot sense the expansion or contraction of the glass substrate under drawing. If, therefore, the temperature of the glass substrate changes during the drawing, a positional error occurs in the drawn original pattern. The glass substrate is made chiefly of synthetic quartz. The coefficient $\alpha$ of linear expansion of synthetic quartz is $0.4 \times 10^{-6}$. Assuming that the temperature of the glass substrate under drawing changes one degree (1° C.), a distance of 130 mm between two points on the glass substrate changes 52 nm ($=130 \times 10^6 \times 1 \times \alpha$). This change is considered to be a positional error over a place for drawing the original pattern. In other words, it is necessary to always keep the temperature of the glass substrate under drawing constant.

To resolve the above problem, conventionally, constant-temperature water whose temperature is regulated with high accuracy is caused to flow near a drawing chamber including a drawing stage, and the temperature of the drawing chamber is regulated to stabilize the temperature of the glass substrate. However, various machine parts are arranged around the glass substrate. For example, an electrooptic barrel, which irradiates a glass substrate with an electron beam, generates heat with electric power that drives a coil. This heat generation is one of causes to vary the temperature of the glass substrate. In order to eliminate this problem, the temperature of constant-temperature water has to be regulated quickly in accordance with temperature variations of the glass substrate. Since, however, the above machine parts are very heavy, their follow-up characteristic to the temperature variations of the constant-temperature water is extremely poor. Moreover, the machine parts are heat generation sources and the amounts of heat to be generated vary from part to part. Thus, the influence upon the glass substrate on which an original pattern is to be formed varies from place to place. As described above, it is very difficult to keep the temperature of the glass substrate under drawing constant even though the temperature of the drawing chamber is simply regulated.

BRIEF SUMMARY OF THE INVENTION

A first object of the present invention is to provide a pattern forming apparatus that is capable of keeping the temperature of a drawing substrate more constant when an original pattern is drawn on the drawing substrate and also capable of drawing a fine original pattern with high precision.

A second object of the present invention is to provide a pattern forming method that is capable of keeping the temperature of a drawing substrate more constant when an original pattern is drawn on the drawing substrate and also capable of drawing a fine original pattern with high precision.

In order to attain the first object, a pattern forming apparatus according to one aspect of the present invention comprises: a drawing chamber including a drawing substrate on which an original pattern is drawn; a first temperature control unit having a first temperature regulator, the first temperature control unit being configured to make a temperature of the drawing chamber constant; a constant-temperature member arranged near the drawing substrate; and a second temperature control unit having a second temperature regulator, the second temperature control unit being configured to control a set temperature of the constant-temperature member independently such that a temperature of the drawing substrate becomes substantially constant when the original pattern is drawn.

In order to attain the second object, a pattern forming method according to another aspect of the present invention comprises: measuring a temperature of a dummy substrate, which is included in a drawing chamber whose temperature is made constant by a first temperature control unit, using a first temperature measuring device when an original pattern is drawn on the dummy substrate while the dummy substrate is varying in position; computing temperature distribution of the dummy substrate based on the temperature measured by the first temperature measuring device; and controlling a second temperature control unit based on the temperature distribution, the second temperature control unit being configured to control a set temperature of a constant-temperature member independently of a temperature of the drawing chamber when the original pattern is drawn on a drawing substrate, and the constant-temperature member being arranged near the drawing substrate.

In order to attain the second object, a pattern forming method according to still another aspect of the present invention comprises: measuring a temperature of a drawing substrate, which is included in a drawing chamber whose temperature is made constant by a first temperature control unit, using a second temperature measuring device when an original pattern is drawn on the drawing substrate; and controlling a second temperature control unit based on the temperature measured by the second temperature measuring device, the second temperature control unit being configured to control a set temperature of a constant-temperature member independently of a temperature of the drawing chamber when the original pattern is drawn on the drawing substrate while the drawing substrate is varying in position, and the constant-temperature member being arranged near the drawing substrate.

According to the pattern forming apparatus and pattern forming method described above, the temperature of the glass substrate on which an original pattern is drawn can be controlled with high precision, independently of the temperature of the drawing chamber. Thus, the follow-up characteristic to the temperature variations of constant-temperature water can greatly be improved.

BRIEF DESCRIPTION OF THE SEVERAL VIEWS OF THE DRAWING

FIG. 4 is a block diagram showing a configuration of a reticle manufacturing apparatus according to a second embodiment of the present invention.

DETAILED DESCRIPTION OF THE INVENTION

Embodiments of the present invention will now be described with reference to the accompanying drawings.

First Embodiment

Figure 1:
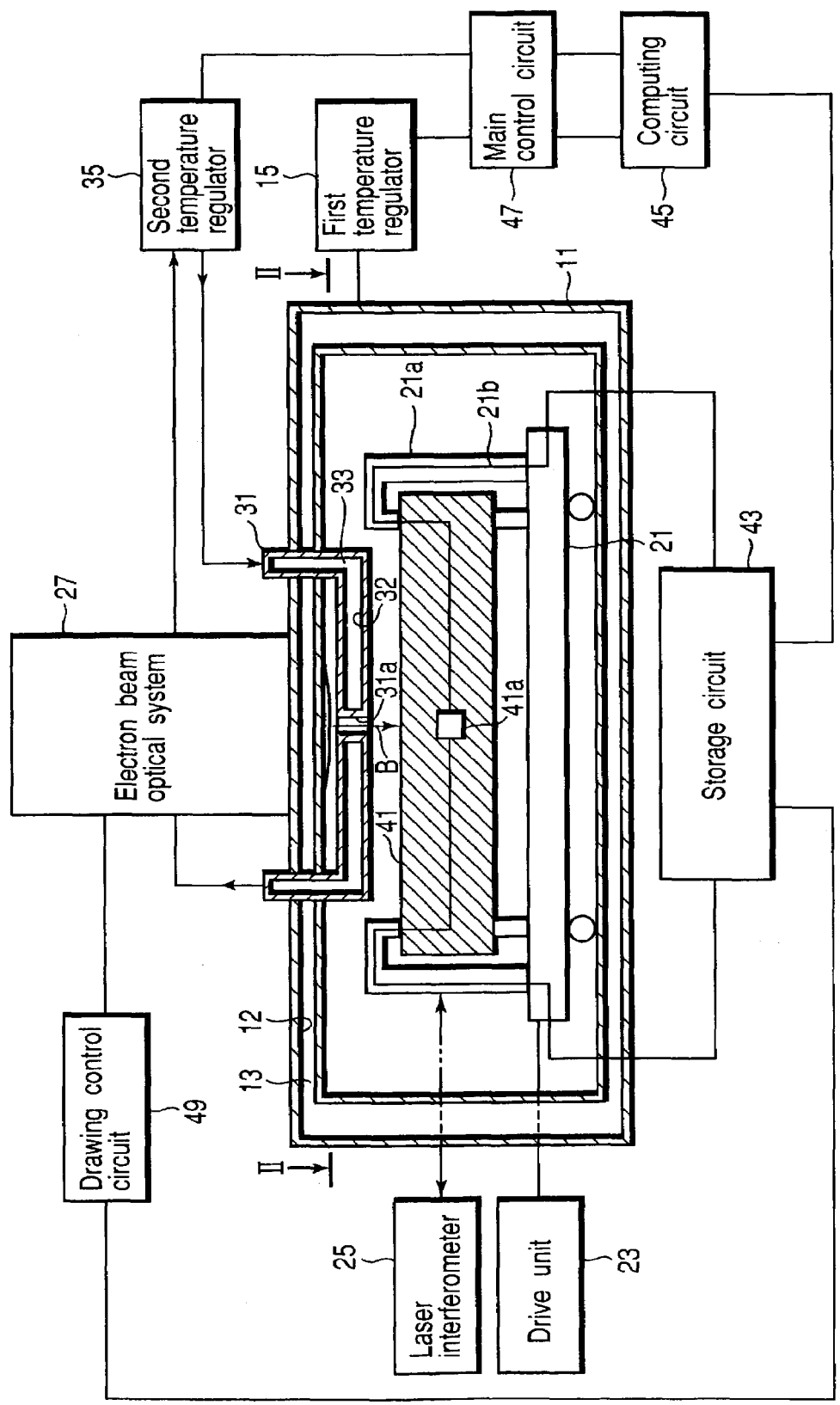
FIG. 1 is a block diagram showing a configuration of a reticle manufacturing apparatus as an example of a fine pattern forming apparatus according to a first embodiment of the present invention.
Figure 2:
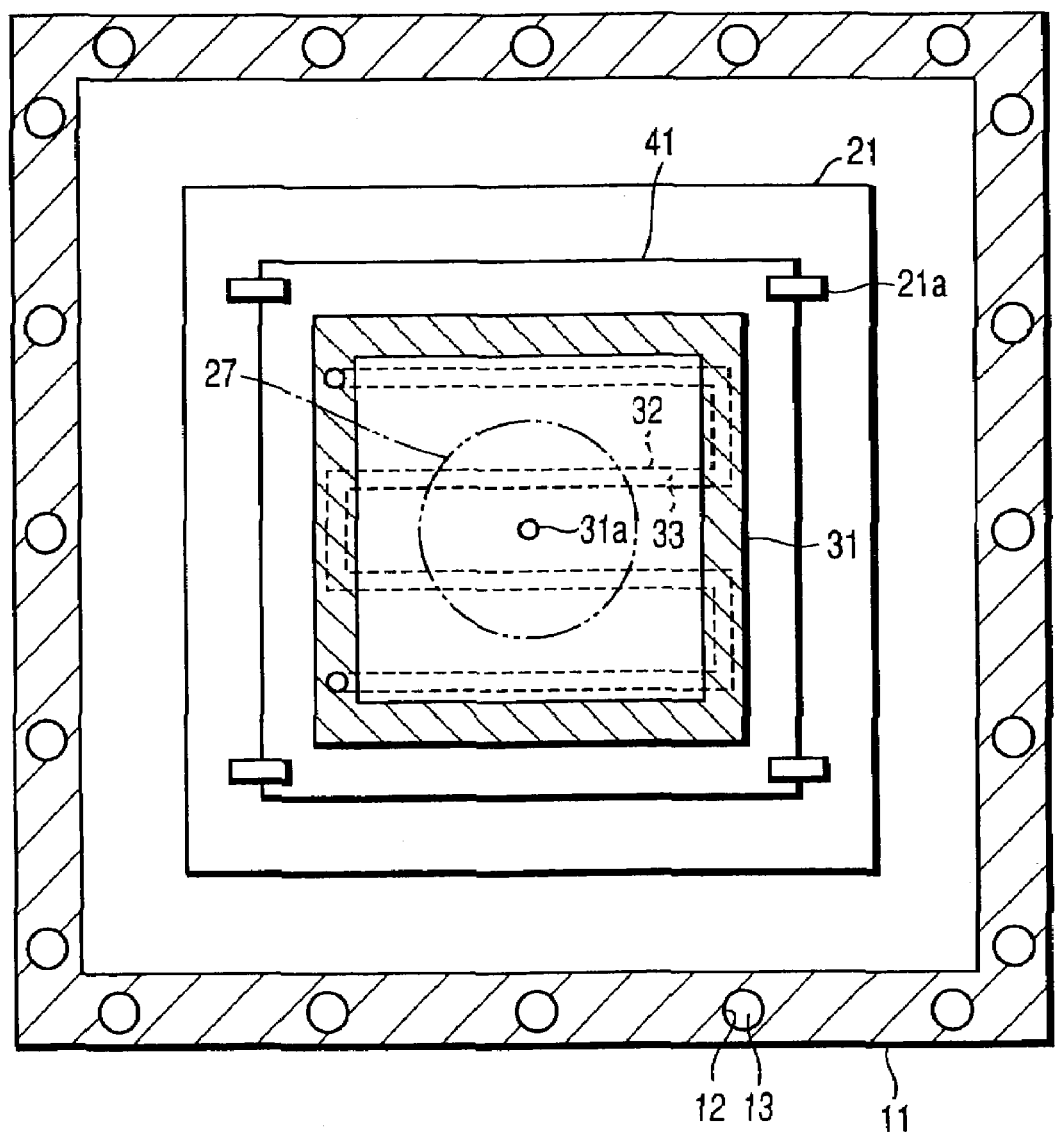
FIG. 2 is a cross-sectional view taken along line II—II of FIG. 1.

FIGS. 1 and 2 show an example of a configuration of a fine pattern forming apparatus according to a first embodiment of the present invention. In the first embodiment, a reticle manufacturing apparatus for drawing an original pattern on a glass substrate to manufacture a reticle is taken as an example of the fine pattern forming apparatus. The apparatus includes a drawing chamber 11, and the drawing chamber 11 has a circulation path 12 through which the temperature-controlled first constant-temperature water (coolant) 13 circulates in the up and down, right and left, and forward and backward walls of the drawing chamber 11. The temperature of the first constant-temperature water 13 is regulated (controlled) with high precision by a first temperature regulator 15. The first temperature regulator 15 makes up a first temperature control unit, together with a main control circuit 47 (described later).

The drawing chamber 11 contains an X-Y stage (drawing stage) 21. The X-Y stage 21 holds a glass substrate (not shown) serving as a drawing substrate on which an original pattern is drawn. The X-Y stage 21 is freely moved and driven in X and Y directions by a drive unit 23. The position of the X-Y stage 21 is precisely measured by a laser interferometer 25.

The above glass substrate is formed by vapor-depositing chromium (Cr) on one side of glass raw material such as synthetic quartz and then applying resist thereon uniformly. The resist-applied surface of the glass substrate is irradiated with an electron beam B from an electron beam optical system 27 serving as an energy beam optical system and the whole surface of the glass substrate is scanned with a beam spot corresponding to drawing data. Thus, an arbitrary chromium (Cr) pattern is formed by controlling chromium (Cr) etching according to a place of the glass substrate, using the resist that deteriorated on the occasion of the scan. Therefore, a reticle is manufactured in which an original pattern corresponding to at least a desired circuit pattern is drawn on the glass pattern.

In the drawing chamber 11, a constant-temperature member 31 is arranged opposite to the glass substrate. The constant-temperature member 31 covers the end portion of the electron beam optical system 27 and has a hole 31a through which the electron beam B emitted from the end portion of the system 27 passes. The constant-temperature member 31 also has a circulation path 32 through which second constant-temperature water (coolant) 33, which is temperature-controlled with high precision, circulates in the wall opposed to at least the glass substrate. The temperature of the second constant-temperature water 33 is controlled (regulated) by a second temperature regulator 35 that is provided separately from the first temperature regulator 15. The second temperature regulator 35 makes up a second temperature control unit, together with a main control circuit 47 (described later).

In the reticle manufacturing apparatus according to the first embodiment, the constant-temperature member 31 is provided near the glass substrate and its temperature can be controlled independently of that of the drawing chamber 11. When an original pattern is drawn on the glass substrate, the temperature of the second constant-temperature water 33 flowing in the constant-temperature member 31 is regulated by the second temperature regulator 35 with high precision. Thus, the follow-up characteristic of the second constant-temperature water 33 to temperature variations in the glass substrate can greatly be improved. Therefore, the glass substrate under drawing can be maintained at an almost constant temperature more easily than when the temperature of the glass substrate is stabilized only by the drawing chamber 11. Consequently, a fine original pattern can be drawn with high precision.

The temperature of the second constant-temperature water 33 is regulated using a dummy mask (dummy substrate) 41 as shown in FIG. 1. The dummy mask 41 is made of the same material as that of the glass substrate and formed in substantially the same shape as that of the glass substrate. Moreover, the dummy mask 41 includes a thermometer (first temperature measuring device) 41a. As will be described later, the thermometer 41a measures the temperature of the dummy mask 41 when an original pattern is drawn on the dummy mask 41, as in the case where an original pattern is actually drawn on the glass substrate. In this case, not only the temperature of an arbitrary portion of the dummy mask 41 can be measured, but also a temperature variation of the dummy mask 41 due to the movement of the X-Y stage 21 (a temperature difference due to the variation in position) can be measured by measuring the temperature of the dummy mask 41 while moving the X-Y stage 21.

The above reticle manufacturing apparatus includes a storage circuit 43, a computing circuit 45 serving as an arithmetic circuit, and a main control circuit 47. The storage circuit 43 stores measurement results obtained by the thermometer 41a. For example, it stores the temperature of the dummy mask 41 held on the X-Y stage 21 when the original pattern is actually drawn on the dummy mask 41. The storage circuit 43 is supplied with the measurement results from the thermometer 41a through wiring 21b in a supporting arm 21a of the X-Y stage 21. The computing circuit 45 computes the distribution of temperature varied with the movement of the dummy mask 41 based on the measurement results of the temperature of the dummy mask 41 stored in the storage circuit 43. The main control circuit 47 controls the first and second temperature regulators 15 and 35 based on the above temperature distribution computed by the computing circuit 45.

The above-described reticle manufacturing apparatus includes a drawing control circuit 49 which supplies a correction value to drawing data for drawing an original pattern with the electron beam optical system 27 when the needed arises. For example, the drawing control circuit 49 corrects the drawing data based on the measurement results of the temperature of the dummy mask 41 stored in the storage circuit 43.

An operation of drawing an original pattern on a glass substrate in the above reticle manufacturing apparatus (a method of manufacturing a reticle) will now be described. Before starting a manufacture of a reticle, the dummy mask 41 including the thermometer 41a is held on the X-Y stage 21. An original pattern is actually drawn on the dummy mask 41 by the electron beam optical system 27 while varying the position of the dummy mask 41. At this time, the temperature of the dummy mask 41 is measured in sequence by the thermometer 41a. More specifically, the dummy mask 41 is held on the X-Y stage 21 and then the inner part of the drawing chamber 11 is evacuated by a vacuum device (not shown). The first temperature regulator 15 controls the temperature of the first constant-temperature water 13 and keeps the set temperature of the drawing chamber 11 constant. In this state, the drive unit 23 moves the X-Y stage 21 in the X and Y directions while the laser interferometer 25 measures the position of the X-Y stage 21 accurately. Thus, an original pattern is drawn in a given position on the dummy mask 41 by irradiating the moving dummy mask 41 with an electron beam B from the electron beam optical system 27. The output of the laser interferometer 25 is used to control the irradiation position of the electron beam B. When the original pattern is drawn, the thermometer 41a measures the temperature of the dummy mask 41 and the storage circuit 43 stores the measured temperature.

After the temperature of the dummy mask 41 is measured at the time of drawing, the manufacture of the actual reticle, i.e., the drawing of the original pattern on the glass substrate starts. Specifically, the glass substrate is held on the X-Y stage 21. After that, as in the above case, the inner part of the drawing chamber 11 is evacuated and the first temperature regulator 15 controls the temperature of the first constant-temperature water 13 to keep the set temperature of the drawing chamber 11 constant.

Moreover, on the occasion of the manufacture of the actual reticle, the computing circuit 45 computes the distribution of temperature varied with the movement of the dummy mask 41 based on the measurement results stored in the storage circuit 43. Based on the temperature distribution, the main control circuit 47 controls at least the second temperature regulator 35. In this case, the main control circuit 47 obtains such set temperature as to minimize a variation of the temperature of the glass substrate held on the X-Y stage 21 from the temperature distribution. The second temperature regulator 35 controls the second constant-temperature water 33 based on the set temperature and maintains the set temperature of the constant-temperature member 31 at the optimal fixed temperature (constant temperature).

In this state, the drive unit 23 moves the X-Y stage 21 in the X and Y directions while the laser interferometer 25 is measuring the position of the X-Y stage 21 precisely. Thus, the electron beam optical system 27 emits the electron beam B to draw an original pattern in a given position on the glass substrate while the glass substrate is moving. Since the temperature of the glass substrate under drawing is kept almost constant, a fine original pattern can be drawn with high precision. In other words, the material and shape of the dummy mask 41 used for measurement of temperature are substantially the same as those of the glass substrate used for manufacture of the reticle. Therefore, the temperature of the glass substrate under drawing can easily be kept almost constant by making the temperature of the constant-temperature member 31 constant by the set temperature based on the measurement results (distribution) of the temperature of the dummy mask 41. Consequently, an original pattern can be drawn with almost no positional errors.

Figure 3A:
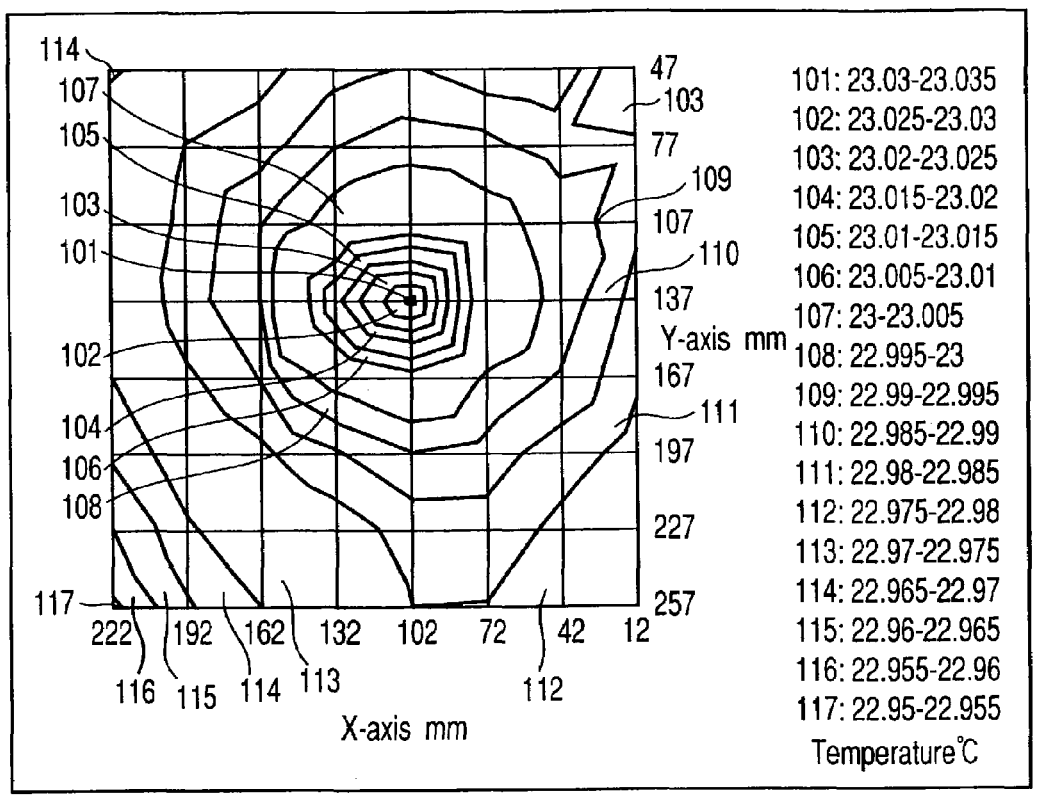
FIG. 3A is a graph of the distribution of temperature before the temperature of a dummy mask used in the reticle manufacturing apparatus becomes constant.
Figure 3B:
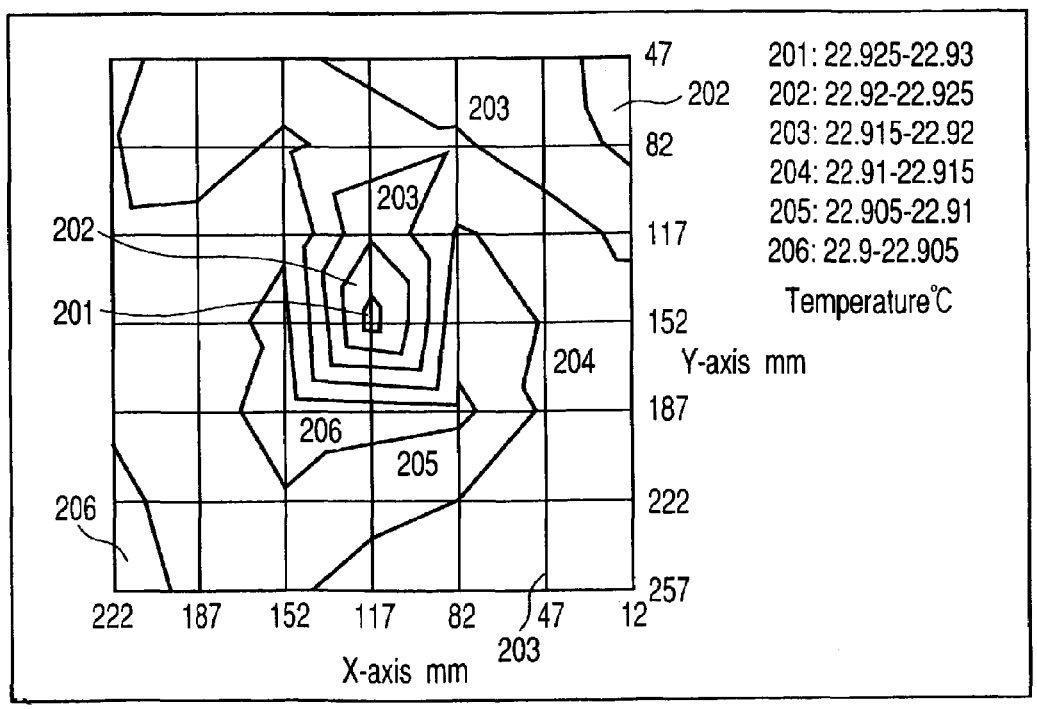
FIG. 3B is a graph showing the distribution of temperature after the temperature of the dummy mask becomes constant.

FIGS. 3A and 3B show the distribution of temperature varied with the movement of the dummy mask 41. FIG. 3A shows the temperature distribution obtained before the temperature of the constant-temperature member 31 is optimized. For example, the set temperature of the drawing chamber 11 is 22.48° C. (incidentally the set temperature of the constant-temperature member 31 is 22.89° C.). FIG. 3B shows the temperature distribution obtained after the temperature of the constant-temperature member 31 is optimized. For example, the set temperature of the drawing chamber 11 is 22.48° C. and that of the constant-temperature member 31 is 22.59° C.

In the above case, the temperature distribution is repeatedly obtained while varying the set temperature of the constant-temperature member 31, and the set temperature in the temperature distribution in which the temperature variation becomes the smallest is used as the optimum temperature of the constant-temperature member 31.

In FIG. 3A, reference numeral 101 indicates a range of temperature of 23.03° C. to 23.035° C., 102 a range of temperature of 23.025° C. to 23.03° C., 103 a range of temperature of 23.02° C. to 23.025° C., 104 a range of temperature of 23.015° C. to 23.02° C., 105 a range of temperature of 23.01° C. to 23.015° C., 106 a range of temperature of 23.005° C. to 23.01° C., 107 a range of temperature of 23.0° C. to 23.005° C., 108 a range of temperature of 22.995° C. to 23.0° C., 109 a range of temperature of 22.99° C. to 22.995° C., 110 a range of temperature of 22.985° C. to 22.99° C., 111 a range of temperature of 22.98° C. to 22.985° C., 112 a range of temperature of 22.975° C. to 22.98° C., 113 a range of temperature of 22.97° C. to 22.975° C., 114 a range of temperature of 22.965° C. to 22.97° C., 115 a range of temperature of 22.96° C. to 22.965° C., 116 a range of temperature of 22.955° C. to 22.96° C., and 117 a range of temperature of 22.95° C. to 22.955° C.

In FIG. 3B, reference numeral 201 indicates a range of temperature of 22.925° C. to 22.93° C., 202 a range of temperature of 22.92° C. to 22.925° C., 203 a range of temperature of 22.915° C. to 22.92° C., 204 a range of temperature of 22.91° C. to 22.915° C., 205 a range of temperature of 22.905° C. to 22.91° C., and 206 a range of temperature of 22.9° C. to 22.905° C.

As is apparent from FIGS. 3A and 3B, the temperature difference is 0.085 (=23.035−22.95)° C. before the temperature of the member 31 is optimally made constant, whereas the temperature difference is 0.03 (=22.93−22.9)° C. after it is optimally made constant. It is seen from this, too that it is effective in maintaining the constant temperature of the glass substrate under drawing to make the temperature of the constant-temperature member 31 constant by the optimum temperature or regulate the set temperature of the second constant-temperature water 33 based on the temperature distribution obtained before the member 31 is optimally made constant and make the set temperature of the member 31 optimum.

As described above, the follow-up characteristic of the second constant-temperature water to the temperature variations of the glass substrate can greatly be improved. In other words, the constant-temperature member whose temperature can be controlled independently of that of the drawing chamber is provided to control the set temperature of the constant-temperature member on the basis of the results obtained by previously measuring the temperature of the dummy mask which is substantially equal to that of the glass substrate. Thus, the constant-temperature member can easily be made constant by the optimum temperature that corresponds to substantially the constant temperature of the glass substrate under drawing. Therefore, the temperature of the glass substrate can be made more constant when the original pattern is drawn than when the temperature of the glass substrate is stabilized only in the drawing chamber; consequently, a fine original pattern can be drawn with high precision, too.

In the foregoing first embodiment, the temperature of the constant-temperature member 31 is made constant or the member 31 is so controlled that its set temperature becomes constant. The first embodiment is not limited to this. For example, the set temperature of the constant-temperature member 31 can easily be varied with the measured temperature of the dummy mask 41 so as not to cause a difference in the temperature of the glass substrate under drawing due to the variations in position. In this case, a fine original pattern can be formed with higher precision.

When an original pattern is drawn on the glass substrate, the drawing control circuit 49 can supply a correction value to drawing data for drawing the original pattern based on the measured temperature of the dummy mask 41 (for example, temperature distribution). It is thus possible to draw a fine original pattern with higher precision and, in this case, the advantage can greatly be improved in combination with the control of the set temperature of the constant-temperature member 31. In other words, when the drawing data is corrected on the basis of the distribution of temperature varied with the movement of the dummy mask 41, a fine original pattern can sufficiently be drawn with high precision to some extent, irrespective of the control of the set temperature of the constant-temperature member 31.

The first embodiment is not limited to the control of only the set temperature of the constant-temperature member 31. For example, the temperature of the glass substrate can be stabilized at the time of drawing by controlling the set temperature of each of the constant-temperature member 31 and drawing chamber 11 based on the temperature distribution obtained when the temperature of the dummy mask 41 is measured.

Second Embodiment

FIG. 4 shows an example of a configuration of a fine pattern forming apparatus according to a second embodiment of the present invention. The second embodiment is directed to a reticle manufacturing apparatus for drawing an original pattern on a glass substrate to manufacture a reticle. In this apparatus, the temperature of the glass substrate is measured at the time of drawing and the set temperature of a constant-temperature member is controlled based on the measurement results. As shown in FIG. 4, a thermometer (second temperature measuring device) 51 is attached on an X-Y stage 21. The thermometer 51 measures the temperature of a glass substrate 53 held on the X-Y stage 21 when an original pattern is drawn thereon. In the reticle manufacturing apparatus, the thermometer 51 attached on the X-Y stage 21 is used in place of the thermometer 41a included in the dummy mask 41 in the first embodiment and measures the temperature of the glass substrate 53 in sequence when a reticle is manufactured.

When the drawing of an original pattern on the glass substrate 53 (the manufacture of a reticle) actually starts, the thermometer 51 measures the temperature of the glass substrate 53. Based on the temperature measured in sequence, a second temperature regulator 35 regulates the temperature of the second constant-temperature water 33 flowing in a constant-temperature member 31 with high precision through, for example, a storage circuit 43, a computing circuit 45 and a main control circuit 47. Thus, the set temperature of the constant-temperature member 31 is varied such that the glass substrate 53 can always be maintained at the optimum temperature, and the temperature of the glass substrate 53 can be made constant at the time of drawing.

In the second embodiment, the set temperature of the constant-temperature member 31 can sequentially be varied with the variation in the position of the glass substrate 53 (position of the X-Y stage 21) based on the temperature of the glass substrate 53 measured by the thermometer 51. Consequently, a fine original pattern can be formed with high precision without varying in temperature due to the variations in the position of the glass substrate 53.

In the second embodiment, too, the temperature of the constant-temperature member 31 is made constant as in the foregoing first embodiment. In other words, the constant-temperature member 31 can easily be controlled such that its set temperature becomes constant.

Moreover, as in the first embodiment, when an original pattern is drawn on the glass substrate 53, a drawing control circuit 49 can supply a correction value to drawing data for drawing the original pattern based on the measured temperature of the glass substrate 53. Thus, a fine original pattern can be drawn with high precision. In this case, too, the advantage can greatly be improved in combination with the control of the set temperature of the constant-temperature member 31. In other words, when the drawing data is corrected on the basis of the measured temperature of the glass substrate 53, a fine original pattern can sufficiently be formed with high precision to some extent, irrespective of the control of the set temperature of the constant-temperature member 31.

The second embodiment is not limited to the control of only the set temperature of the constant-temperature member 31. For example, the temperature of the glass substrate 53 can be stabilized at the time of drawing by controlling the set temperature of each of the constant-temperature member 31 and drawing chamber 11 based on the measured temperature of the glass substrate 53.

Neither the first embodiment nor the second embodiment is limited to the above reticle manufacturing apparatus but can be applied to various types of fine pattern forming apparatus.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A pattern forming apparatus comprising:
   a drawing chamber configured to accommodate a drawing substrate on which a pattern is drawn;
   a first temperature controller configured to control a temperature of the drawing chamber;
   a constant-temperature member arranged in a position for providing and/or absorbing heat with the drawing substrate when the pattern is drawn on the drawing substrate; and
   a second temperature controller configured to control a set temperature of the constant-temperature member such that a temperature of the drawing substrate becomes substantially constant when the pattern is drawn.

2. The pattern forming apparatus according to claim 1, wherein the constant-temperature member has a circulation path through which a coolant circulates, and the second temperature controller controls a temperature of the coolant circulating through the circulation path to be substantially constant.

3. The pattern forming apparatus according to claim 2, further comprising:
   a first temperature measuring device configured to measure a temperature of a dummy substrate when the pattern is drawn on the dummy substrate;
   a storage circuit configured to store the temperature of the dummy substrate measured by the first temperature measuring device while the dummy substrate is varying in position;
   a computing circuit configured to compute temperature distribution of the dummy substrate based on the temperature stored in the storage circuit; and
   a main control circuit configured to control the second temperature controller based on the temperature distribution.

4. The pattern forming apparatus according to claim 3, wherein the dummy substrate comprises a material which is substantially the same as a material of the drawing substrate and formed in substantially a same shape as a shape of the drawing substrate.

5. The pattern forming apparatus according to claim 3, wherein the first temperature measuring device is attached to the dummy substrate.

6. The pattern forming apparatus according to claim 3, further comprising:
   an energy beam optical system configured to draw the pattern, the energy beam optical system supplying a correction value to drawing data to draw the pattern based on the temperature measured by the first temperature measuring device.

7. The pattern forming apparatus according to claim 1, wherein the constant-temperature member has a circulation path through which a coolant circulates, and the second temperature controller controls a temperature of the coolant circulating through the circulation path in accordance with the temperature of the drawing substrate.

8. The pattern forming apparatus according to claim 7, further comprising:
   a second temperature measuring device configured to measure the temperature of the drawing substrate when the pattern is drawn; and
   a main control circuit configured to control the second temperature controller based on the temperature measured by the second temperature measuring device.

9. The pattern forming apparatus according to claim 8, wherein the second temperature measuring device is attached to a stage which is movably provided to hold the drawing substrate.

10. The pattern forming apparatus according to claim 8, further comprising:
    an energy beam optical system configured to draw the pattern, the energy beam optical system supplying a correction value to drawing data to draw the pattern based on the temperature measured by the second temperature measuring device.

11. The pattern forming apparatus according to claim 1, wherein the constant-temperature member is a constant-temperature vessel.

12. The pattern forming apparatus according to claim 11, wherein the constant-temperature vessel has a hole for a drawing beam to pass through.

13. The pattern forming apparatus according to claim 11, wherein at least a part of the constant-temperature vessel is outside of the drawing chamber.

14. The pattern forming apparatus according to claim 1, wherein the first temperature controller is a first temperature regulator and the second temperature controller is a second temperature regulator.

* * * * *